US010032487B2

(12) United States Patent
Shifren et al.

(10) Patent No.: US 10,032,487 B2
(45) Date of Patent: *Jul. 24, 2018

(54) ONE-TIME AND MULTI-TIME PROGRAMMING USING A CORRELATED ELECTRON SWITCH

(71) Applicant: ARM Ltd., Cambridge (GB)

(72) Inventors: Lucian Shifren, San Jose, CA (US); Robert Campbell Aitken, San Jose, CA (US); Vikas Chandra, Fremont, CA (US); Bal S. Sandhu, Fremont, CA (US)

(73) Assignee: ARM Ltd., Cambridge (GB)

( * ) Notice: Subject to any disclaimer, the term of this patent is extended or adjusted under 35 U.S.C. 154(b) by 0 days.

This patent is subject to a terminal disclaimer.

(21) Appl. No.: 15/086,767

(22) Filed: Mar. 31, 2016

(65) Prior Publication Data
US 2017/0287528 A1 Oct. 5, 2017

(51) Int. Cl.
| G11C 11/00 | (2006.01) |
| G11C 7/00 | (2006.01) |
| G11C 13/00 | (2006.01) |
| G11C 17/08 | (2006.01) |
| G11C 17/16 | (2006.01) |
| G11C 17/18 | (2006.01) |

(52) U.S. Cl.
CPC ........... *G11C 7/00* (2013.01); *G11C 13/0007* (2013.01); *G11C 13/0069* (2013.01); *G11C 17/08* (2013.01); *G11C 17/16* (2013.01); *G11C 17/18* (2013.01); *G11C 2013/009* (2013.01); *G11C 2013/0078* (2013.01); *G11C 2213/15* (2013.01)

(58) Field of Classification Search
CPC ..... G11C 7/00; G11C 13/0014; G11C 13/025; G11C 17/18; G11C 17/08; G11C 13/0069; G11C 13/0007; G11C 17/16; G11C 2213/15; G11C 2013/009; G11C 2013/0078

See application file for complete search history.

(56) References Cited

U.S. PATENT DOCUMENTS

| 6,567,304 | B1 | 5/2003 | Kleveland | |
| 9,514,814 | B1* | 12/2016 | Sandhu | ............. G11C 13/0069 |
| 2004/0239369 | A1* | 12/2004 | Hsu | ..................... H04L 25/0272 |
| | | | | 326/115 |
| 2005/0058009 | A1* | 3/2005 | Yang | ..................... B82Y 10/00 |
| | | | | 365/232 |

(Continued)

OTHER PUBLICATIONS

Notification of Transmittal of the International Search Report and the Written Opinion of the international Searching Authority, or the Declaration, App. No. PCT/GB2017/050837, dated Jun. 13, 2017, 1 Page.

(Continued)

*Primary Examiner* — Mohammed A Bashar
(74) *Attorney, Agent, or Firm* — Berkeley Law & Technology Group, LLP

(57) ABSTRACT

An apparatus including a Correlated Electron Switch (CES) element and a programing circuit is provided. The programing circuit provides a programing signal to the CES element to program the CES element to an impedance state of multiple impedance states when a number of times the CES element has been programed is less than a threshold.

21 Claims, 7 Drawing Sheets

(56) References Cited

U.S. PATENT DOCUMENTS

2008/0106926 A1   5/2008   Brubaker

OTHER PUBLICATIONS

International Search Report, App. No. PCT/GB2017/050837, dated Jun. 13, 2017, 4 Pages.
Written Opinion of the International Searching Authority, App. No. PCT/GB2017/050837, dated Jun. 13, 2017, 8 Pages.

* cited by examiner

ONE-TIME AND MULTI-TIME PROGRAMMING USING A CORRELATED ELECTRON SWITCH

TECHNICAL FIELD

The present disclosure relates to apparatus and methods for one-time and multi-time programing using Correlated Electron Switch (CES) elements.

BACKGROUND

Read-only memory is a type of non-volatile memory that does not lose stored data on being power cycled. One-time programmable (OTP) memory is a form of programmable read-only memory in which data is stored permanently and cannot be modified. In other words, OTP memory can only be programmed to store data once, and the stored data cannot be rewritten/overwritten. A typical OTP memory cell starts off with all bits reading '1'. An electric signal is used to burn a fuse that effectively allows setting of each bit of an OTP memory cell. That is, burning a fuse using the electrical signal may cause the bit to read '0'. The memory is programmed by blowing fuses.

Another category of non-volatile memory is reprogrammable read-only memory that is extensively used in, for example, security applications, fast computing applications, military applications, etc. The data stored in the memory cells of reprogrammable memory are re-erasable and re-usable. Examples of reprogrammable read-only memory include multiple time programmable (MTP) memory or few time programmable (FTP) memory. Erasable programmable read-only memory (EPROMs), electrically erasable programmable read-only memory (EEPROMs), flash EPROMS, etc., are examples of MTP memory.

SUMMARY

According to a first aspect of the present techniques, an apparatus is provided. The apparatus includes a Correlated Electron Switch (CES) element. The apparatus further includes a programing circuit. The programing circuit may be configured to provide a programing signal to the CES element to program the CES element to one of a plurality of impedance states when a number of times the CES element has been programed is less than a threshold.

According to a second aspect of the present techniques, a method is provided. The method comprises determining a threshold programming number of a Correlated Electron Switch (CES) element; retrieving a count indicative of how many times the CES element has been programmed; determining if the count is less than the threshold; and providing a programing signal to the CES element, responsive to determining the count is less than the threshold, to program the CES element to one of a plurality of impedance states.

According to a third aspect of the present techniques, an apparatus is provided. The apparatus comprises a plurality of Correlated Electron Switch (CES) elements, wherein each CES element is in a first impedance state of a plurality of impedance states; and a plurality of connection pads, each connection pad being coupled to at least one CES element of the plurality of CES elements and configured to receive a programing signal for the at least one CES element to program the at least one CES element to a desired impedance state when the number of times the at least one CES element has been programed is less than a threshold.

In embodiments, the plurality of CES elements may be arranged in an array. The apparatus may be configured as an integrated chip. Each CES element is in a first impedance state of multiple impedance states.

The following features apply equally to each of the above aspects.

Preferably, the threshold is an integer greater than or equal to one.

In embodiments, the programing circuit programs the CES element to the impedance state by physically modifying the CES element when the number of times the CES element is programed is equal to the threshold minus one.

In embodiments, the plurality of impedance states comprise at least a high impedance state and a low impedance state.

In embodiments, the apparatus may comprise a counter configured to store a count of the number of times the CES element has been programed, wherein the programing circuit is configured to increment the count in response to the CES element being programed. The counter may comprise at least one additional CES element.

In embodiments, the apparatus may comprise a control circuit configured to disable the programing circuit from programing the CES element when the number of times the CES element has been programed is equal to the threshold.

In embodiments, the apparatus may comprise a read circuit to read the impedance state of the CES element. The read circuit may comprise a clamping circuit.

In embodiments, the method may further comprise: determining when the count is equal to the threshold minus one; and programming the CES element to the impedance state, when the count is determined to be equal to the threshold minus one, by physically modifying the CES element.

In embodiments, the method may further comprise incrementing the count in response to the CES element being programed.

In embodiments, the method may further comprise disabling programing of the CES element when the count is determined to equal the threshold.

In a related aspect of the present technique, there is provided a non-transitory data carrier carrying code which, when implemented on a processor, causes the processor to carry out the methods described herein.

As will be appreciated by one skilled in the art, the present techniques may be embodied as a system, method or computer program product. Accordingly, present techniques may take the form of an entirely hardware embodiment, an entirely software embodiment, or an embodiment combining software and hardware aspects.

Furthermore, the present techniques may take the form of a computer program product embodied in a computer readable medium having computer readable program code embodied thereon. The computer readable medium may be a computer readable signal medium or a computer readable storage medium. A computer readable medium may be, for example, but is not limited to, an electronic, magnetic, optical, electromagnetic, infrared, or semiconductor system, apparatus, or device, or any suitable combination of the foregoing.

Computer program code for carrying out operations of the present techniques may be written in any combination of one or more programming languages, including object oriented programming languages and conventional procedural programming languages. Code components may be embodied as procedures, methods or the like, and may comprise sub-components which may take the form of instructions or sequences of instructions at any of the levels of abstraction, from the direct machine instructions of a native instruction set to high-level compiled or interpreted language constructs.

BRIEF DESCRIPTION OF THE DRAWINGS

The techniques are diagrammatically illustrated, by way of example, in the accompanying drawings, in which.

DETAILED DESCRIPTION

Figure 1:
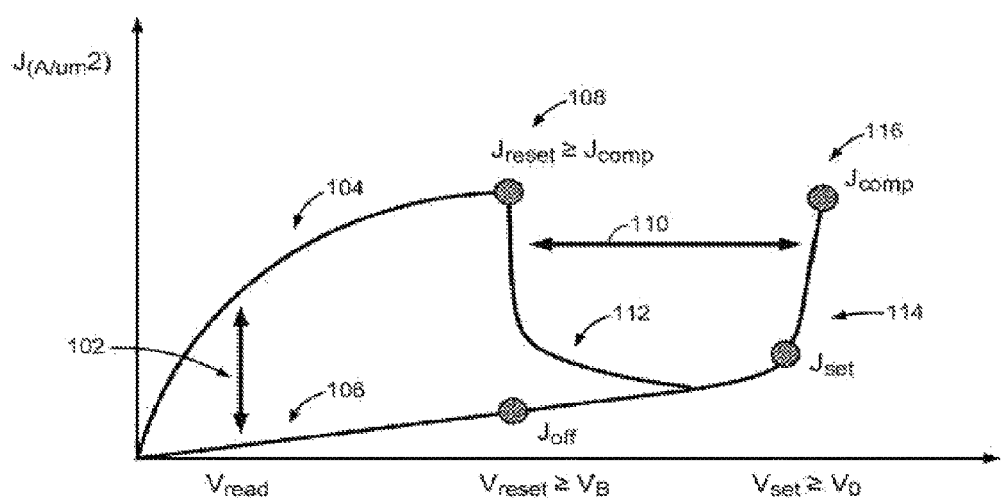
FIG. 1 shows a plot of current density versus voltage for a Correlated Electron Switch (CES) element.

Broadly speaking, embodiments of the present techniques provide apparatus and methods to provide a one-time programmable (OTP) memory and a multi-time programmable (MTP) memory. The apparatus comprises at least one Correlated Electron Switch (CES) element, which comprises a correlated electron material (CEM). The CES may be used both as non-volatile storage as well as a circuit element that can enable connectivity in a circuit. As explained in more detail below, the CES element comprises a material that may transition between predetermined detectable memory states based at least in part on a transition of (at least a portion of) the material between a conductive state and an insulative state. The CES element is programmable such that it may store a configuration in a non-volatile manner, and use its impedance state to enable connectivity.

The term "correlated electron switch" is used interchangeably herein with "CES", "CES element", "CES device", "correlated electron random access memory", "CeRAM", and "CeRAM device".

Non-volatile memories are a class of memory in which the memory cell or element does not lose its state after power supplied to the device is removed. In flash memory devices, an ability to keep random access (erase/write single bits) was sacrificed for speed and higher bit density. Flash remains a non-volatile memory of choice. Nevertheless, it is generally recognized that flash memory technology may not scale easily below 40 nanometers (nm); thus, new non-volatile memory devices capable of being scaled to smaller sizes are actively being sought.

A CES is a particular type of switch formed (wholly or in part) from a CEM. Generally speaking, a CES may exhibit an abrupt conductive or insulative state transition arising from electron correlations rather than solid state structural phase changes. (Examples of solid state structural phase changes include crystalline/amorphous in phase change memory (PCM) devices, or filamentary formation and conduction in resistive RAM devices). An abrupt conductor/insulator transition in a CES may be responsive to a quantum mechanical phenomenon, in contrast to melting/solidification or filament formation.

A quantum mechanical transition of a CES between an insulative state and a conductive state may be understood in terms of a Mott transition. In a Mott transition, a material may switch from an insulative state to a conductive state if a Mott transition condition occurs. When a critical carrier concentration is achieved such that a Mott criteria is met, the Mott transition will occur and the state will change from high resistance/impedance (or capacitance) to low resistance/impedance (or capacitance).

A "state" or "memory state" of the CES element may be dependent on the impedance state or conductive state of the CES element. In this context, the "state" or "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive and insulative states. As discussed in the particular example implementations below, material of a CES element sandwiched between conductive terminals may be placed in an insulative state by application of a first programming signal across the terminals having a voltage $V_{reset}$ and current $I_{reset}$ at a current density $J_{reset}$, or placed in a conductive state by application of a second programming signal across the terminals having a voltage $V_{set}$ and current $I_{set}$ at current density $J_{set}$.

Additionally or alternatively, a CES element may be provided as a memory cell in a cross-point memory array whereby the CES element may comprise a metal/CEM/metal (M/CEM/M) stack formed on a semiconductor. Such an M/CEM/M stack may be formed on a diode, for example. In example implementations, such a diode may be selected from the group consisting of a junction diode and a Schottky diode. In this context, it should be understood that "metal" means a conductor, that is, any material that acts like a metal, including, for example, polysilicon or a doped semiconductor.

FIG. 1 shows a plot of current density versus voltage across terminals (not shown) for a CES element. Based, at least in part, on a voltage applied to terminals of the CES element (e.g., in a write operation), the CES may be placed in a conductive state or an insulative state. For example, application of a voltage $V_{set}$ and current density $J_{set}$ may place the CES element in a conductive memory state and application of a voltage $V_{reset}$ and a current density $J_{reset}$ may place the CES element in an insulative memory state.

Following placement of the CES in an insulative state or conductive state, the particular state of the CES element may be detected by application of a voltage $V_{read}$ (e.g., in a read operation) and detection of, for example, a current or current density at terminals or bias across the terminals of the CES element.

Both the current and the voltage of the CES element need to be controlled in order to switch the CES element state. For example, if the CES element is in a conductive state, and voltage $V_{reset}$ required to place the device in an insulative memory state, is applied thereto, the CES element will not switch into the insulative state until the current density is also at the required value of $J_{reset}$. This means that, when the CES element is used to read/write from a memory, unintended rewrites may be prevented since even if sufficient voltage is applied to the CES element, a memory state change will only occur if the required current density is also applied.

The CES element of FIG. 1 may include any transition metal oxide (TMO), such as, for example, perovskites, Mott insulators, charge exchange insulators, and Anderson disorder insulators. In particular implementations, a CES element may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES device. In an embodiment, a CES element may be prepared without electroforming. Other implementations may employ other transition metal compounds without deviating from claimed subject matter. For example, {M(chxn)2Br}Br2 where M may comprise Pt, Pd, or Ni, and chxn comprises 1R,2R-cyclohexanediamine, and other such metal complexes may be used without deviating from claimed subject matter.

When sufficient bias is applied (e.g., exceeding a band-splitting potential) and the aforementioned Mott condition is met (injected electron holes=the electrons in a switching region), the CES element may rapidly switch from a conductive state to an insulative state via the Mott transition. This may occur at point 108 of the plot in FIG. 1. At this point, electrons are no longer screened and become localized. This correlation may result in a strong electron-electron interaction potential which splits the bands to form an insulator. While the CES element is still in the insulative state, current may be generated by transportation of electron holes. When sufficient bias is applied across terminals of the CES, electrons may be injected into a metal-insulator-metal (MIM) diode over the potential barrier of the MIM device. When sufficient electrons have been injected and sufficient potential is applied across terminals to place the CES element in a set state, an increase in electrons may screen electrons and remove a localization of electrons, which may collapse the band-splitting potential forming a metal.

Current in a CES element may be controlled by an externally applied "compliance" condition determined based, at least in part, on the external current limited during a write operation to place the CES element in a conductive state. This externally applied compliance current may also set a condition of a current density for a subsequent reset operation to place the CES in an insulative state.

As shown in the particular implementation of FIG. 1, a current density $J_{comp}$ applied during a write operation at point 116 to place the CES element in a conductive state may determine a compliance condition for placing the CES element in an insulative state in a subsequent write operation. For example, the CES element may be subsequently placed in an insulative state by application of a current density $J_{reset} \geq J_{comp}$ at a voltage $V_{reset}$ at point 108, where $J_{comp}$ is externally applied.

The compliance condition therefore may set a number of electrons in a CES element which are to be "captured" by holes for the Mott transition. In other words, a current applied in a write operation to place a CES element in a conductive memory state may determine a number of holes to be injected to the CES element for subsequently transitioning the CES element to an insulative memory state.

As pointed out above, a reset condition may occur in response to a Mott transition at point 108. As pointed out above, such a Mott transition may occur at condition in a CES element in which a concentration of electrons n equals a concentration of electron holes p.

A current or current density in a region 104 of the plot shown in FIG. 1 may exist in response to injection of holes from a voltage signal applied across terminals of a CES element. Here, injection of holes may meet a Mott transition criterion for the conductive state to insulative state transition at current IMI as a critical voltage VMI is applied across terminals of CES element.

A "read window" 102 for detecting a memory state of a CES element in a read operation may be set out as a difference between a portion 106 of the plot of FIG. 1 while the CES element is in an insulative state, and a portion 104 of the plot of FIG. 1 while the CES element is in a conductive state at a read voltage $V_{read}$.

Similarly, a "write window" 110 for placing a CES element in an insulative or conductive memory state in a write operation may be set out as a difference between $V_{reset}$(at $J_{reset}$) and $V_{set}$(at $J_{set}$). Establishing $|_{set}|>|V_{reset}|$ enables a switch between conductive and insulative states. $V_{reset}$ may be approximately at a band splitting potential arising from correlation and $V_{set}$ may be approximately twice the band splitting potential. In particular implementations, a size of write window 110 may be determined, at least in part, by materials and doping of the CES element. The transition from high resistance (or high capacitance) to low resistance (or low capacitance) can be represented by a singular impedance of the device.

Figure 2:
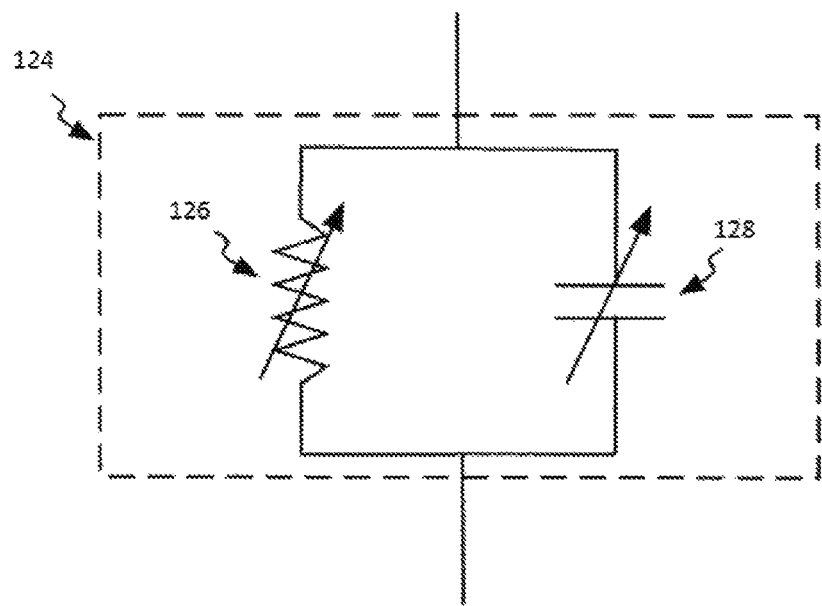
FIG. 2 is a schematic diagram of an equivalent circuit to a CES device.

FIG. 2 depicts a schematic diagram of an equivalent circuit of an example variable impeder device (such as a CES device), such as variable impeder device 124. As mentioned, variable impeder device 124 may comprise characteristics of both variable resistance and variable capacitance. For example, an equivalent circuit for a variable impeder device may, in an embodiment, comprise a variable resistor, such as variable resistor 126 in parallel with a variable capacitor, such as variable capacitor 128. Although the variable resistor 126 and variable capacitor 128 are depicted in FIG. 2 as discrete components, variable impeder device 124 may equally comprise a substantially homogenous CES element, wherein the CES element comprises characteristics of variable capacitance and variable resistance. Table 1 below depicts an example truth table for an example variable impedance device, such as variable impeder device 124.

TABLE 1

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})$~0 | $Z_{low}(V_{applied})$ |

Figure 3:
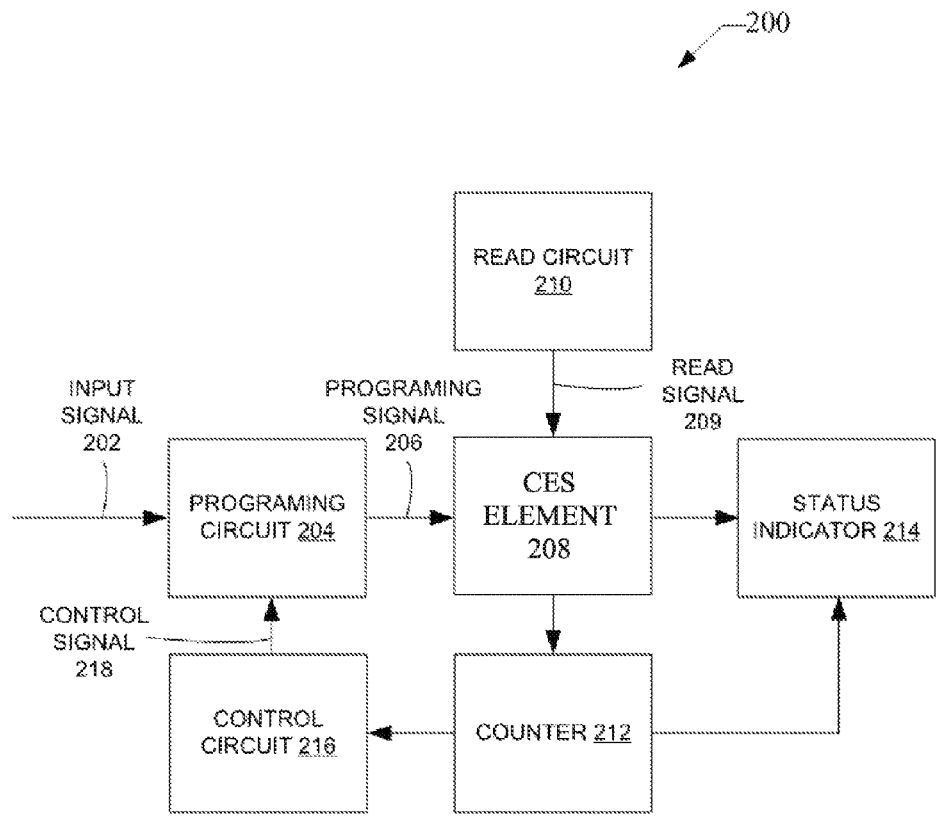
FIG. 3 shows a schematic view of an exemplary apparatus for implementing one time and multi time programing using CES.

FIG. 3 shows a schematic view of an exemplary apparatus 200 for implementing one-time programing and multi-time programing using a Correlated Electron Switch (CES). The apparatus 200 comprises a CES element 208. The CES element 208 is capable of being programed to one of a plurality of impedance states. In an embodiment, the plurality of impedance states may include at least a high impedance state and a low impedance state. An impedance state of the CES element 208 may correspond to a resistive state, a capacitive state or a combination thereof. In an example, the CES element 208 may be programed to be in the high impedance state when a data input to the CES element 208 corresponds to a logic level one, and may be programed to be in the low impedance state when the data input to the CES element 208 corresponds to a logic level zero. In another example, the CES element 208 may be programed to a high impedance state when the data input to the CES element 208 corresponds to a logic level zero, and a low impedance state when the data input to the CES element 208 corresponds to a logic level one. Though FIG. 3 illustrates only one CES element 208, the apparatus 200 may include a plurality of CES elements 208 that are each capable of being programed to the same or different impedance states.

The apparatus 200 includes a programing circuit 204. In an embodiment, CES element 208 is programed into a desired impedance state by applying an appropriate programing signal(s) 206 supplied by the programing circuit 204. In an embodiment, the CES element 208 may be deposited in a low impedance state (i.e. the initial impedance state of the CES element 208 is a low impedance state). In another embodiment, the CES element 208 may be deposited in a high impedance state (i.e. the initial impedance state of the CES element 208 is a high impedance state).

The programing circuit 204 receives an input signal 202 indicative of data to be written on the CES element 208. The programing circuit 204 is coupled to the CES element 208. The programing circuit 204 provides a programing signal 206, in response to the input signal 202, to the CES element 208 to program the CES element 208 to an impedance state, when a number of times the CES element 208 is programed is less than a threshold number. As used herein, the term "threshold" or "threshold number" refers to a number of times the CES element 208 can be programed. In an embodiment where the CES element 208 forms part of a one-time programmable (OTP) memory, the threshold may be equal to one, indicating that the CES element 208 may be programmed once only. When the threshold is equal to one, the programing circuit 204 may program the CES element 208 to the desired impedance state by physically modifying the CES element 208. In an embodiment, the desired impedance state may be the high impedance state. As a result of the physical modification, the CES element 208 is not able to be programed again. Thus, the CES element 208 is rendered as one-time programmable.

In an embodiment where the CES element 208 forms part of a multi-time programmable (MTP) memory, the threshold may be an integer number greater than one, indicating that the CES element 208 may be programmed more than once. When the threshold is greater than one, the number of times the CES element 208 has been programed is monitored or counted. When the number of times the CES element 208 has been programed is equal to the threshold minus one, then the next time the CES element 208 is programed to an impedance state it is programed by physically modifying the CES element 208. Thus, once the threshold number has been reached, the CES element 208 cannot be programed any further/again. Hence, in this embodiment, the CES element 208 is rendered as multi-time programmable. In an embodiment, when the number of times the CES element 208 has been programed reaches the threshold, the programing circuit 204 is disabled from programing the CES element 208 further, instead of physically modifying the CES element 208.

The programing signal 206 may include a voltage signal, a current signal, or both a voltage and a current signal. In an embodiment, the programing circuit 204 programs the CES element 208 to a SET state, i.e. a low impedance state, by applying a programming signal which has a voltage greater than a SET voltage, and a current density greater than a threshold current density required for programing the CES element 208 to the SET state, i.e. to the low impedance state (see FIG. 1 and the corresponding discussion above). In one example, the SET voltage may be 1.2 volts (V), but this is merely an illustrative, non-limiting example value. The SET voltage and SET current density may vary depending on a design or manufacturing procedure of the CES element 208.

Further, the programing circuit 204 programs the CES element 208 to a RESET state, i.e. a high impedance state, by applying a programing signal 206 which has a voltage greater than or equal to a RESET voltage, and with a current density greater than or equal to a threshold current density required to switch the CES element 208 to the RESET state i.e. to the high impedance state (see FIG. 1 and the corresponding discussion above). In an example, the RESET voltage may be 0.6 V, but this is merely an illustrative, non-limiting example value. The RESET voltage and RESET current density may vary depending on a design or manufacturing procedure of the CES element 208.

The programing circuit 204 may include various circuit elements (not shown) designed to provide the aforementioned programing signal 206 to the CES element 208.

The CES element 208 is an impedance-based memory component for storing data. In the present techniques, impedance and memory properties of the CES element 208 may be used for one-time and multi-time programing. The apparatus 200 may further comprise a counter 212 for monitoring and storing the number of times the CES element 208 has been programed. In an example, the counter 212 may include at least one additional CES element. Each additional CES element may be used as one bit of the counter 212. In this example, the apparatus 200 may comprise an additional programing circuit (not shown) for programing the additional CES element(s), based on the number of times the CES element 208 has been programed. In another example, any conventional counter may be used as the counter 212. The programing circuit 204 may increment the count of the counter 212 in response to the CES element 208 being programed. In an example implementation, a CES element 208 configured to be one-time programmable (OTP) may itself be used as the counter 212. For instance, when the CES element 208 is fabricated in a first impedance state and programed to a second impedance state, checking the impedance state of the CES element 208 may enable determination of whether the CES element 208 has been programed. When it is found that the CES element 208 is in the second impedance state, it is determined that the CES element 208 has been programed once, and consequently, further programing of the OTP CES element 208 is disabled.

In an embodiment, the apparatus 200 may further include a status indicator 214 coupled to the CES element 208. The status indicator 214 acts as a flag and indicates whether the number of times the CES element 208 has been programed has reached the threshold. For example, the status indicator 214 may be zero if the number of times the CES element 208 has been programed is less than the threshold, and may be set to one when the number of times the CES element 208 has been programed is equal to the threshold. The status indicator 214 may be coupled to the counter 212 to check if the threshold number has been reached. In an embodiment, an additional CES element may be configured as a status indicator 214.

The apparatus 200 may further include a control circuit 216. The control circuit 216 may be configured to disable the programing circuit 204 from programing the CES element 208 when the number of times the CES element 208 has been programed is equal to the threshold. In an example implementation, the control circuit 216 may monitor the status indicator 214 and/or compare a value stored in the counter 212 with the threshold, to determine whether the number of times the CES element 208 has been programed is equal to the threshold. Upon reaching the threshold, the control circuit 216 may de-assert a control signal 218 provided to the programing circuit 216. The term "de-assert" is used herein to mean that a control signal 218 may be applied (if no control signal was applied earlier), a control signal 218 may be removed (if a control signal was applied earlier), or that the properties of the control signal 218 are modified. The programing circuit 216 may be configured to disable when the control signal 218 is de-asserted. In an example, the control signal 218 may be a write enable signal.

The apparatus 200 may further comprise a read circuit 210 configured to read the impedance state of the CES element 208. The read circuit 210 may provide a read signal 209 to the CES element 208 to ascertain the impedance state of the CES element 208. In an example implementation, the read circuit 210 comprises a clamping circuit (not shown). The clamping circuit is configured to limit a voltage and/or current density of the read signal 209 such that the read signal 209 does not accidentally switch the impedance state of the CES element 208. Thus, the clamping circuit limits the voltage and/or current density of the read signal 209 to below the levels required to switch between impedance states, as described above with reference to FIG. 1.

Figure 4:
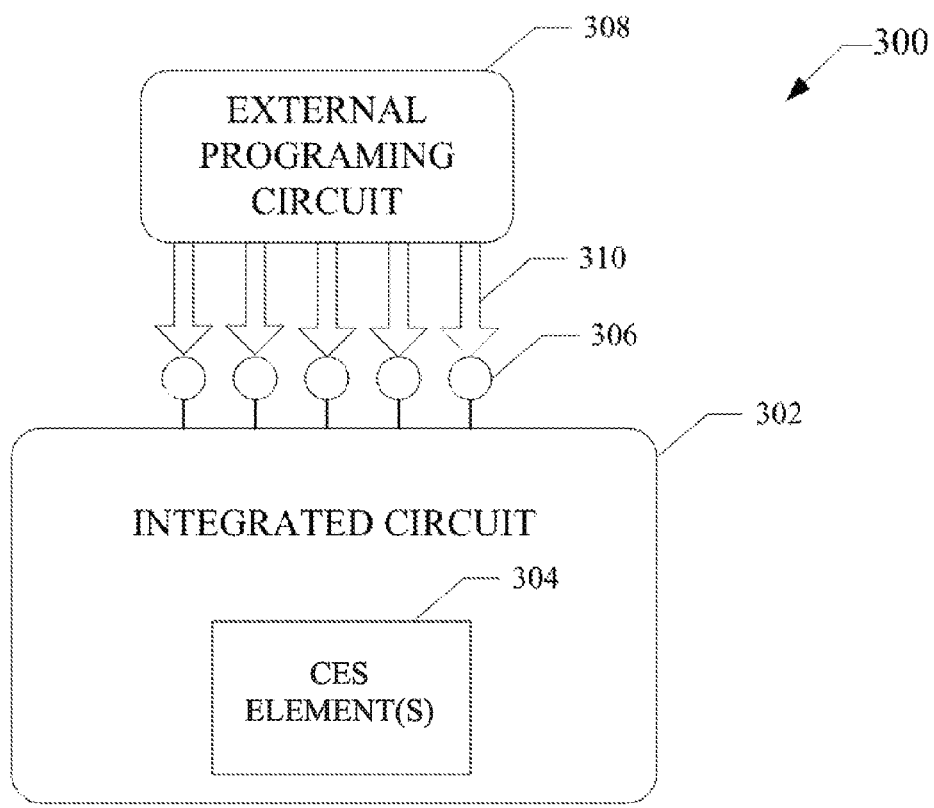
FIG. 4 shows a schematic view of another exemplary apparatus for implementing one time and multi time programing using a CES element.

FIG. 4 shows a schematic view of an exemplary apparatus 300 for implementing one-time and multi-time programing using a CES element 304. In an example implementation, the apparatus 300 is configured as an integrated circuit (IC) chip 302. In an example implementation, the CES element 304 may be fabricated on a silicon wafer of the integrated circuit (IC) chip 302. The CES element(s) 304 may be fabricated in a first impedance state. According to one embodiment, the first impedance state may be the low impedance state. In an example, the IC chip 302 may comprise a single bit CES element 304. In another example, a plurality of CES element(s) 304 may be fabricated on the IC chip 302. The plurality of CES elements 304 may be arranged in an array to provide multiple bits.

The IC chip 302 may comprise one or more connection pads 306. Each connection pad 306 is coupled to at least one CES element 304 of the plurality of CES element(s) 304. The connection pads 306 provide an external programing circuit 308 with access to the CES element(s) 304 to, for example, provide a programing signal 310 to the CES element(s) 304 to program the CES element(s) 304 to a desired impedance state when the number of times the CES element 304 is programed is less than a threshold. In an embodiment, the threshold may be equal to one, thereby configuring the CES element(s) 304 as one-time programmable. In an embodiment, the programing signal 310 programs the CES element 304 to the desired impedance state by physically modifying the CES element 304. The external programing circuit 308 programs at least one CES element of the CES element(s) 304 to a second impedance state. The second impedance state may be the high impedance state. In one example implementation, the programing circuit 308 provides the programing signal 310 such that the at least one CES element is physically modified to the second impedance state. The connection pads 306 may be accessed for programing the CES element(s) 304 before packaging the IC chip 302. In embodiments where the CES element is used for one-time programming, once the programing circuit 308 programs the at least one CES element, the connection pads 306 are not contacted thereafter. Generally speaking, the connection pads 306 are disabled to provide the programing signal 310 when the number of times the CES element 304 has been programed is equal to the threshold. Thus, the programing circuit 308 is disabled from programing the CES element 304 more than the threshold number of times. Hence, the CES element(s) 304 may not be re-accessed for reprograming, thereby rendering the CES element(s) 304 as one-time programmable or multi-time programmable.

In an embodiment, a CES element (such as the CES element 208 or the CES element 304) of a substantially smaller size can be used for one-time programing as compared to the size of a CES element that can be used for multiple-time programing. Physically modifying the CES element is typically easier when the size, and consequently the surface area, of the CES element is small, without affecting properties of the CES element. The smaller surface area of the CES element allows substantially more current density to flow through the CES element, which allows the CES element to be physically modified by applying electric fields of substantially lower field strength or intensity.

Figure 5:
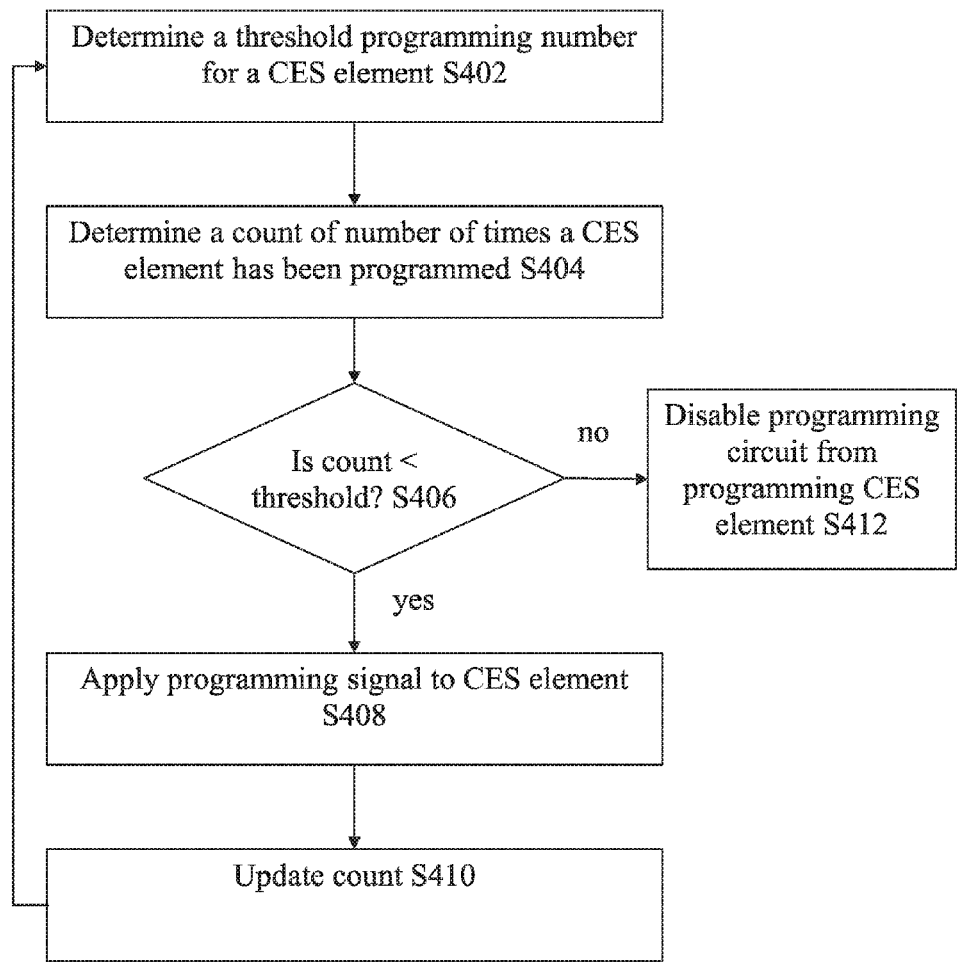
FIG. 5 illustrates an example method for implementing one time and multi time programing using a CES element.

FIG. 5 depicts an example method 400 for implementing one-time and multi-time programing using a CES element. The method begins by determining a threshold programming number for a CES element (step S402). The threshold may be pre-defined for programing the or each CES element, and is indicative of a maximum number of times the CES element can be programed. The threshold is an integer greater than or equal to one. If the threshold is one, the CES element is one-time programmable. If the threshold is greater than one, the CES element is multi-time programmable. The threshold value may be stored for each CES element.

In an embodiment, the number of times the CES element is programed is monitored by, for example, the counter 212 described above. A count of the number of times the CES element has been programed is determined (step S404). The counter 212, a status indicator 214, a control circuit 216, or other suitable element or module may be configured to determine whether the count is less than the threshold for the CES element (step S406). If the count is greater than or equal to the threshold, a programming circuit may be disabled (step S412) from programming the CES element again (if it has not already been disabled), as described above. In an embodiment, the programing of the CES element is disabled by physically modifying the CES element. In another embodiment, the programing of the CES element is disabled by preventing an access to the CES element. In another embodiment, a programing circuit providing the programing signal to the CES element is disabled, thereby preventing the CES element from being programed. Thus, the programming circuit (or other circuit/module) prevents the CES element from being programmed more than the threshold number of times.

If the count is determined to be less than the threshold, the CES element may be programmed into a particular impedance state at least once more. The CES element is programed by applying a programing signal, which may include a voltage signal and/or a current signal. At step S408, a programing signal is provided to the CES element for programing the CES element to one of a plurality of impedance states, only when the count of the number of times the CES element has been programed is less than the threshold.

When, or after, the programming signal is applied to the CES element, the count is updated (step S410), and the new count may be stored for future use. The next time a CES element is to be programmed, the process may begin again at step S402 (i.e. determining the threshold of the particular CES element being programmed). In embodiments, step S404 may be performed before step S402, or at substantially the same time.

Figure 6:
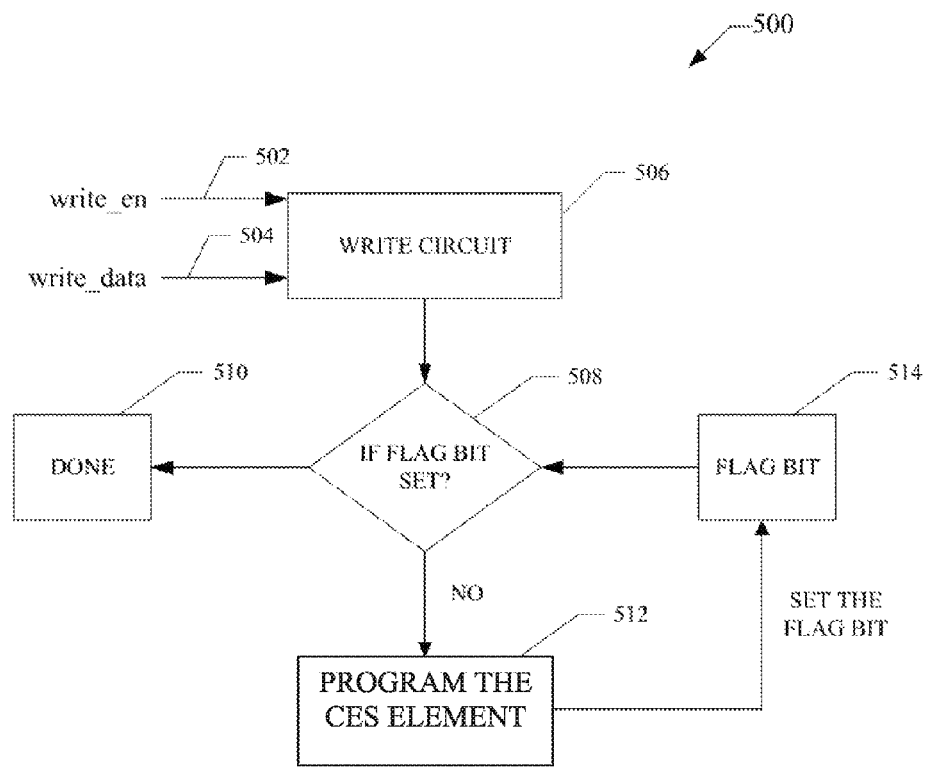
FIG. 6 illustrates an example method for implementing one time programing using a CES element.

FIG. 6 illustrates an example method 500 for implementing one-time programing using a CES element. The programing circuit comprises a write circuit. At step 506, the write circuit receives a write enable signal 502 and a data signal 504 comprising data to be written to the CES element. At step 508, the programing circuit checks if a flag bit is set. The flag bit is indicative of whether the CES element has been programed. In one example implementation, the flag bit is set when the CES element is programed. If the flag bit is set, then the process ends at step 510, thereby rendering the CES element as one time programmable. If the flag bit is not set, then the programing circuit programs the CES element based upon the data signal 504 at step 512. At step 514, the flag bit is set.

Figure 7:
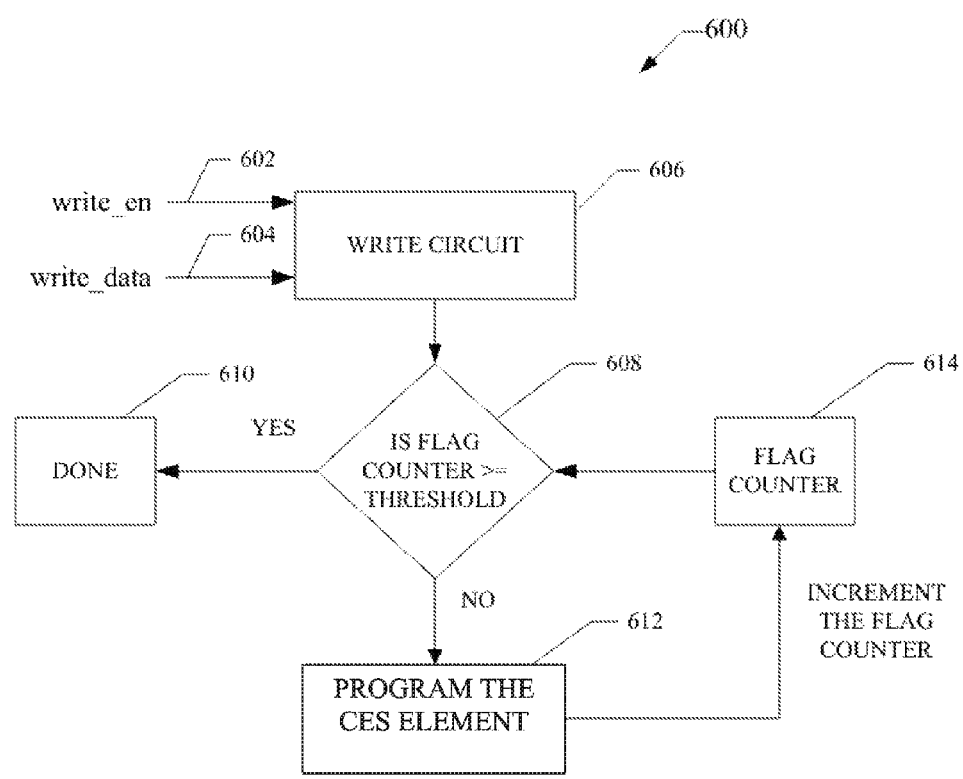
FIG. 7 illustrates an example method for implementing multi time programing using the CES element.

FIG. 7 illustrates an example method 600 for implementing multi-time programing using the CES element. The programing circuit comprises a write circuit that receives a write enable signal 602 and a data signal 604, at step 606. The programing circuit retrieves a count indicating a number of times the CES element is programed. The count may be stored in a flag counter. In an example, the flag counter is another CES element. At step 608, the programing circuit checks if the count stored in the flag counter is greater than or equal to a threshold defined for programing the CES element. If the count is greater than or equal to the threshold, then the process ends at step 610. If the count is less than the threshold, then the data signal is written to the CES element at step 612, and the flag counter is incremented at step 614. The process continues until the count is greater than or equal to the threshold.

In an example, a CES element implemented as one-time programmable or multi-time programmable as described herein may be used as a source of embedded memory in various systems, such as, for example: system on chip (SoC), payment cards, such as, credit cards, debit cards, a stored-value card, gift cards, fleet cards, etc., security systems for storing encryption keys, video game consoles, radio-frequency identification (RFID) tags, implantable medical devices, high-definition multimedia interfaces (HDMI), automotive electronics products, IC chips used in smartphones, etc.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

The invention claimed is:

1. An apparatus comprising:
   a Correlated Electron Switch (CES) element comprising correlated electron material (CEM), the CEM comprising sufficient transition metal oxide to enable switching between or among two or more impedance states based, at least in part, on a concentration of electron holes in the CEM; and
   a programming circuit configured to:
      determine a pre-defined threshold number of times that the CES element is permitted to be programmed; and
      provide a programming signal to the CES element responsive to a determination of a count of a number of times that the CES element has been programmed is less than the pre-defined threshold number of times, the programming signal to program the CES element to one of the two or more impedance states.

2. The apparatus of claim 1, wherein the pre-defined threshold number of times is an integer greater than or equal to two.

3. The apparatus of claim 1, wherein the programming circuit is configured to program the CES element to one of the two or more impedance states by disabling programming of the CES element when the number of times that the CES element has been programmed equals the pre-defined threshold number of times minus one.

4. The apparatus of claim 1, wherein the two or more impedance states comprise at least a high impedance state and a low impedance state.

5. The apparatus of claim 1, further comprising a counter configured to store the count of the number of times that the CES element has been programmed, wherein the programming circuit is configured to increment the count in response to the CES element being programmed.

6. The apparatus of claim 5, wherein the counter comprises at least one additional CES element.

7. The apparatus of claim 1, further comprising a control circuit configured to disable the programming circuit from programming the CES element when the number of times that the CES element has been programmed is equal to the pre-defined threshold number of times that the CES element is permitted to be programmed.

8. The apparatus of claim 1, further comprising a read circuit to read an impedance state of the two or more impedance states.

9. The apparatus of claim 8, wherein the read circuit comprises a clamping circuit.

10. The apparatus of claim 1, wherein the pre-defined threshold number of times corresponds to a maximum number of times that the CES element is permitted to be programmed.

11. A method comprising:
   determining a pre-defined threshold programming number of times that a Correlated Electron Switch (CES) element is permitted to be programmed, the CES element comprising correlated electron material (CEM), the CEM comprising sufficient transition metal oxide to enable switching between or among two or more impedance states based, at least in part, on a concentration of electron holes in the CEM;
   retrieving a count indicative of a number of times that the CES element has been programmed;
   determining if the count is less than the pre-defined threshold programming number of times that the CES element is permitted to be programmed; and
   providing a programming signal to the CES element, responsive to determining that the count is less than the pre-defined threshold number of times, to program the CES element to one of the two or more impedance states.

12. The method of claim 11, wherein the pre-defined threshold number of times is an integer number of times greater than or equal to two.

13. The method of claim 11, further comprising:
   determining when the count is equal to the pre-defined threshold number of times minus one; and
   programming the CES element to an impedance state of the two or more impedance states, when the count is determined to be equal to the pre-defined threshold number of times minus one, by disabling programming the CES element.

14. The method of claim 11, further comprising incrementing the count in response to the CES element being programmed.

15. The method of claim 11, further comprising disabling programming of the CES element when the count is determined to equal the pre-defined threshold number of times.

16. An apparatus comprising:
a plurality of Correlated Electron Switch (CES) elements, wherein each CES element comprises correlated electron material (CEM), the CEM comprising sufficient transition metal oxide to enable switching between or among two or more impedance states based, at least in part, on a concentration of electron holes in the CEM; and
a plurality of connection pads, each connection pad being coupled to at least one CES element of the plurality of CES elements and configured to receive a programming signal for the at least one CES element to program the at least one CES element to a desired impedance state based, at least in part, on a determination that a count of a number of times that the at least one CES element has been programmed is less than a pre-defined threshold number of times, the pre-defined threshold number of times that the CES element is permitted to be programmed being at least two.

17. The apparatus of claim 16, wherein the programming signal is to program the at least one CES element to the desired impedance state of the two or more impedance states by disabling programming the at least one CES element when the number of times that the at least one CES element has been programmed is equal to the pre-defined threshold number of times minus one.

18. The apparatus of claim 16, wherein the plurality of connection pads are disabled to provide the programming signal when the number of times that the CES element has been programmed is equal to the pre-defined threshold number of times.

19. The apparatus of claim 16, wherein a first impedance state, of the two or more impedance states, is a low impedance state.

20. The apparatus of claim 16, wherein the apparatus is configured as an integrated circuit.

21. The apparatus of claim 16, wherein the plurality of CES elements are arranged in an array.

* * * * *